(12) United States Patent
Gallagher et al.

(10) Patent No.: US 12,026,445 B1
(45) Date of Patent: Jul. 2, 2024

(54) METHOD AND APPARATUS FOR PHOTONIC CIRCUIT SIMULATION

(71) Applicant: Photon Design Ltd., Oxford (GB)

(72) Inventors: Dominic Francis Gallagher, Oxford (GB); Thomas Felici, Oxon (GB)

(73) Assignee: Photon Design Ltd., Oxford (GB)

( * ) Notice: Subject to any disclaimer, the term of this patent is extended or adjusted under 35 U.S.C. 154(b) by 0 days.

(21) Appl. No.: 18/295,355

(22) Filed: Apr. 4, 2023

(51) Int. Cl.
*G06F 30/398* (2020.01)
*G06F 30/31* (2020.01)
*G06F 30/392* (2020.01)

(52) U.S. Cl.
CPC ............ *G06F 30/398* (2020.01); *G06F 30/31* (2020.01); *G06F 30/392* (2020.01)

(58) Field of Classification Search
CPC .................................................. G06F 30/398
USPC .......................................................... 716/111
See application file for complete search history.

(56) References Cited

U.S. PATENT DOCUMENTS

2022/0050951 A1* 2/2022 Adolf .................... G06F 30/392

OTHER PUBLICATIONS

International Search Report and Written Opinion for International Application No. PCT/GB2023/050892, dated Oct. 12, 2023, 15 pages.
Leijtens M et al., "S-Matrix Oriented CAD-Tool for Simulating Complex Integrated Optical Circuits", IEEE Journal of Selected Topics in Quantum Electronics, vol. 2, No. 2, Jun. 1, 1996, pp. 257-262.
Ploeg Sequoia et al., "Simphony: An Open-Source Photonic Integrated Circuit Simulation Framework" , Computing in Science and Engineering, vol. 23, No. 1, Jul. 27, 2020, pp. 65-74.
Siew S Y et al., "Review of Silicon Photonics Technology and Platform Development", Journal of Lightwave Technology, vol. 39, No. 13, Mar. 17, 2021, pp. 4374-4389.
Wim Bogaerts et al., "Silicon Photonics Circuit Design: Methods, Tools and Challenges", Laser & Photonics Reviews, vol. 12, No. 4, Mar. 12, 2018, 1700237, 29 pages.

* cited by examiner

*Primary Examiner* — Eric D Lee
(74) *Attorney, Agent, or Firm* — COOLEY LLP

(57) ABSTRACT

In an embodiment, a non-transitory medium stores code representing instructions to be executed by a processor. The instructions comprise code to cause the processor to identify, automatically and without requiring user input, a plurality of computational regions for a photonic integrated circuit (PIC). Each computational region from the plurality of computational regions is associated with a portion of the PIC different than remaining computational regions from the plurality of computational regions. The plurality of computational regions include adjoining regions of computational regions. The instructions comprise code to cause the processor to perform electromagnetic simulations on each computational region from the plurality of computational regions to produce a plurality of electromagnetic simulation results. The instructions comprise code to cause the processor to assemble, based on the plurality of adjoining computational regions, the plurality of electromagnetic simulation results to determine a simulated response for the PIC.

22 Claims, 6 Drawing Sheets

400

Identify, automatically and without requiring user input, a plurality of computational regions for a photonic integrated circuit (PIC), each computational region from the plurality of computational regions associated with a portion of the PIC different than remaining computational regions from the plurality of computational regions, the plurality of computational regions including adjoining regions of computational regions 402

Perform electromagnetic simulations on each computational region from the plurality of computational regions to produce a plurality of electromagnetic simulation results 404

Assemble, based on the plurality of adjoining computational regions, the plurality of electromagnetic simulation results to determine a simulated response for the PIC 406

Identify, automatically and without requiring user input, a plurality of computational regions for a photonic integrated circuit (PIC), each computational region from the plurality of computational regions associated with a portion of the PIC different than remaining computational regions from the plurality of computational regions, the plurality of computational regions including adjoining regions of computational regions 402

Perform electromagnetic simulations on each computational region from the plurality of computational regions to produce a plurality of electromagnetic simulation results 404

Assemble, based on the plurality of adjoining computational regions, the plurality of electromagnetic simulation results to determine a simulated response for the PIC 406

Cause display of a photonic integrated circuit (PIC) represented in a graphical user interface (GUI) 502

Receive, based on an input from a user, indications of a plurality of computational regions for the PIC, each computational region from the plurality of computational regions associated with a portion of the PIC different than remaining computational regions from the plurality of computational regions, the plurality of computational regions including adjoining regions of computational regions 504

Perform electromagnetic simulations on each computational region from the plurality of computational regions to produce a plurality of electromagnetic simulation results 506

Assemble, based on the adjoining regions of computational regions, the plurality of electromagnetic simulation results to determine a simulated response for the PIC 508

Send information that represents the PIC and that is associated with control of a lithographic mask writer to fabricate the PIC based on the information 510

Indicate, at a display and in response to an input from a user, representations of a first computational region for a photonic integrated circuit (PIC) and a second computational region for the PIC different than the first computational region, the first computational region adjoining at least partially with the second computational region via an adjoining boundary 602

↓

Perform simulations on (1) the first computational region to produce a first simulation result, and (2) the second computational region to produce a second simulation result 604

↓

Determine a simulated response for the PIC based on the first simulation result, the second simulation result, and the adjoining boundary 606

↓

Send information that represents the PIC and that is associated with control of a lithographic mask writer to fabricate the PIC based on the information 608

FIG. 6

METHOD AND APPARATUS FOR PHOTONIC CIRCUIT SIMULATION

FIELD

One or more embodiments are related to a method and apparatus for photonic circuit simulation.

BACKGROUND

It can be desirable to run simulations for a circuit, including circuits in the optical domain. Known simulation techniques, however, can be overly burdensome for computers and for users. For example, computers using known techniques can be slow and/or unable to simulate even relatively simple circuits.

SUMMARY

In an embodiment, a non-transitory medium stores code representing instructions to be executed by one or more processors. The instructions comprise code to cause the one or more processor to identify, automatically and without requiring user input, a plurality of computational regions for a photonic integrated circuit (PIC). Each computational region from the plurality of computational regions is associated with a portion of the PIC different than remaining computational regions from the plurality of computational regions. The plurality of computational regions include adjoining regions of computational regions. The instructions comprise code to cause the one or more processor to perform electromagnetic simulations on each computational region from the plurality of computational regions to produce a plurality of electromagnetic simulation results. The instructions comprise code to cause the one or more processor to assemble, based on the plurality of adjoining computational regions, the plurality of electromagnetic simulation results to determine a simulated response for the PIC.

In an embodiment, a method includes causing display, via a processor, of a photonic integrated circuit (PIC) represented in a graphical user interface (GUI). The method further includes receiving, via the processor and based on an input from a user, indications of a plurality of computational regions for the PIC. Each computational region from the plurality of computational regions is associated with a portion of the PIC different than remaining computational regions from the plurality of computational regions. The plurality of computational regions include adjoining regions of computational regions. The method further includes performing, via the processor, electromagnetic simulations on each computational region from the plurality of computational regions to produce a plurality of electromagnetic simulation results. The method further includes assembling, via the processor and based on the adjoining regions of computational regions, the plurality of electromagnetic simulation results to determine a simulated response for the PIC. The method further includes sending, via the processor, information that represents the PIC and that is associated with control of a lithographic mask writer to fabricate the PIC based on the information.

In an embodiment, an apparatus includes a memory a processor operatively coupled to the memory. The processor is configured to indicate, at a display and in response to an input from a user, representations of a first computational region for a photonic integrated circuit (PIC) and a second computational region for the PIC different than the first computational region. The first computational region adjoins at least partially with the second computational region via an adjoining boundary. The processor is further configured to perform simulations on (1) the first computational region to produce a first simulation result, and (2) the second computational region to produce a second simulation result. The processor is further configured to determine a simulated response for the PIC based on the first simulation result, the second simulation result, and the adjoining boundary. The processor is further configured to send information that represents the PIC and that is associated with control of a lithographic mask writer to fabricate the PIC based on the information.

BRIEF DESCRIPTION OF THE DRAWINGS

FIG. 4 shows a flowchart of a method to generate a simulated response for a PIC, according to an embodiment.

FIG. 5 shows a flowchart of a method to generate a simulated response for a PIC, according to an embodiment.

FIG. 6 shows a flowchart of a method to generate a simulated response for a PIC, according to an embodiment.

DETAILED DESCRIPTION

Electromagnetic simulators can be executed to simulate circuits. But some circuits, including fairly simple circuits, can be too large and/or complex to simulate using one electromagnetic simulator. As such, the simulation may fail, time out, be slow, be inaccurate, be incomplete, and/or the like.

In some known techniques, a circuit in a simulation is broken up into building blocks, and each building block is simulated separately. The result of each simulation is then exported to a circuit simulator, where the circuit simulator represents each building block symbolically and is not generally aware of the geometry of each building block. When the results of the circuit simulator are satisfactory, a description of the circuit is exported to a layout editor. The layout editor obtains geometric information about each building block from another source and then generates a full layout of the circuit. The layout may now need to be adjusted, taking account of layout rules such as minimal spacing. This may involve changes to the representation of the PIC and therefore the Circuit Simulator is re-run. Several iterations between Circuit Simulator and Layout Editor can occur before the design is accepted. Finally the layout editor generates a mask file, which is used to generate a lithographic mask set for manufacturing. The aforementioned known technique, however, can be slow, computationally inefficient, and/or the like. Therefore, some implementations herein are related to a PIC simulation environment that is faster, more computationally efficient, and/or the like compared to known techniques.

In some implementations, the representation of a PIC (or functional block thereof) is laid out in full within the simulation environment of an electromagnetic simulator. A human and/or a software model then identifies within and/or adds to the representation of the PIC computational regions for the PIC. Each computational region can be associated with a unique region of the representation of the PIC. Any light flowing into a region of the representation of the PIC not covered by a computational region is assumed to be lost during simulation; therefore, computational regions can touch adjacent regions of the representation of the PIC where light would flow within the PIC. Thereafter, electromagnetic simulations are performed on each computational region. These individual simulations can then be automatically (e.g., without requiring human intervention) assembled together to produce a simulated response for the PIC. The simulation occurs with reference to the edges where pairs of computational regions touch. If the simulated response of the PIC is unsatisfactory (e.g., as determined by a human, as determined by a software model, etc.), the layout can be altered, and the computational regions can adjust to accommodate the altered layout (e.g., automatically).

Figure 1:
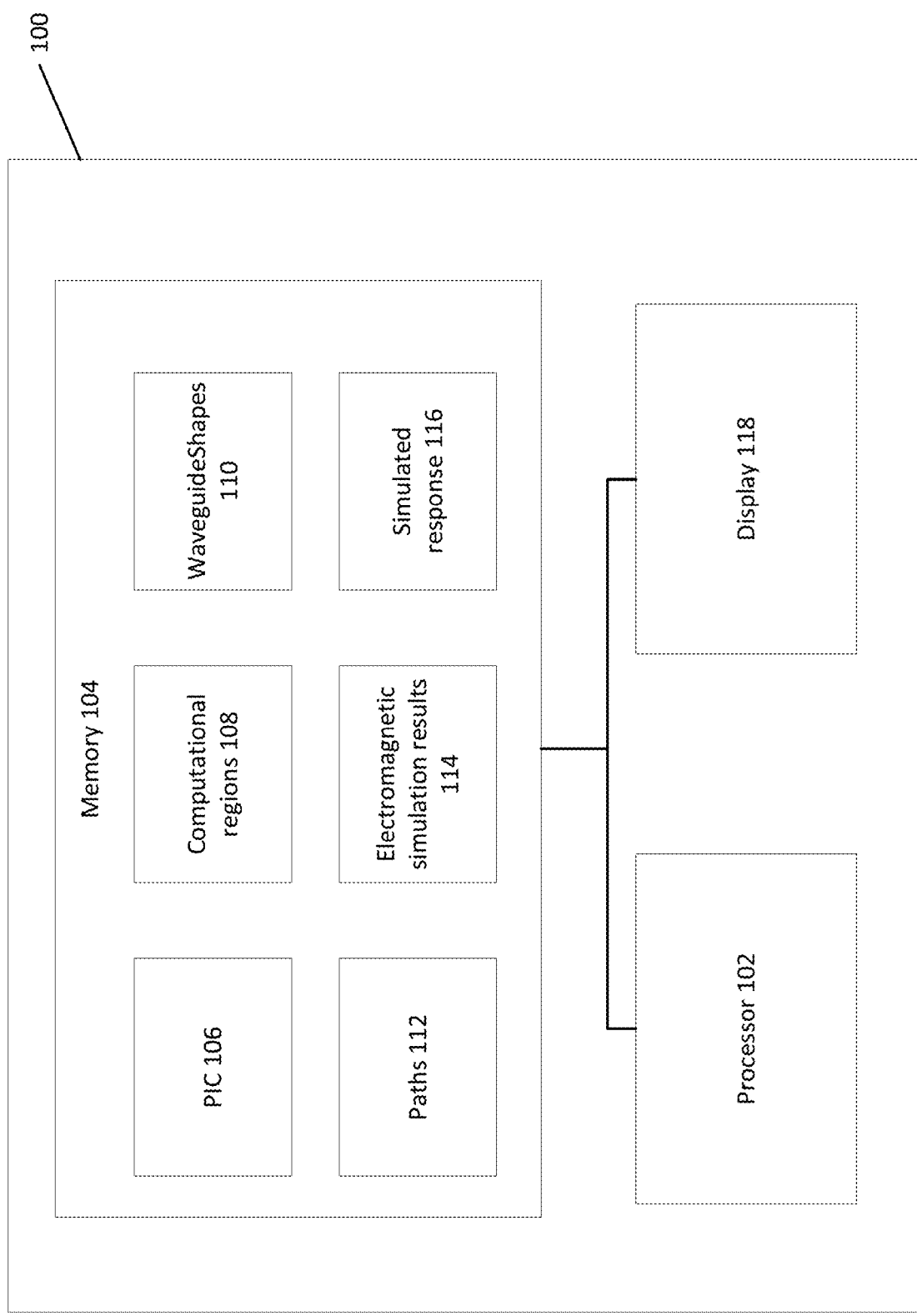
FIG. 1 shows a block diagram of an electromagnetic simulation compute device, according to an embodiment.

FIG. 1 shows a block diagram of an electromagnetic simulation compute device 100, according to an embodiment. The electromagnetic simulation compute device 100 can be any type of compute device, such as a server, a desktop, a laptop, a tablet, a phone, an internet of things (IOT) device, and/or the like. The electromagnetic simulation compute device 100 can includes a processor 102, memory 104, and display 118, each operatively coupled to one another (e.g., via a system bus).

The display 118 can any type of display, such as a CRT (Cathode Ray tube) display, LCD (Liquid Crystal Display) display, LED (Liquid Emitting Diode) display, OLED (Organic Light Emitting Diode) display, and/or the like. The display can be used to display, for example, a representation of a PIC, computational regions of the representation of the PIC, simulation results, and/or the like.

The processor 102 can be, for example, a hardware based integrated circuit (IC) or any other suitable processing device configured to run and/or execute a set of instructions or code. For example, the processor 102 can be a general-purpose processor, a central processing unit (CPU), an accelerated processing unit (APU), an application specific integrated circuit (ASIC), a field programmable gate array (FPGA), a programmable logic array (PLA), a complex programmable logic device (CPLD), a programmable logic controller (PLC) and/or the like. In some implementations, the processor 102 can be configured to run any of the methods and/or portions of methods discussed herein.

The memory 104 can be, for example, a random-access memory (RAM), a memory buffer, a hard drive, a read-only memory (ROM), an erasable programmable read-only memory (EPROM), and/or the like. The memory 104 can be configured to store data used by the processor 102 to perform the techniques discussed herein. In some instances, the memory 104 can store, for example, one or more software programs and/or code that can include instructions to cause the processor 102 to perform one or more processes, functions, and/or the like. In some implementations, the memory 104 can include extendible storage units that can be added and used incrementally. In some implementations, the memory 104 can be a portable memory (for example, a flash drive, a portable hard disk, and/or the like) that can be operatively coupled to the processor 102. In some instances, the memory 104 can be remotely operatively coupled with a compute device.

The memory 104 can include (e.g., store) a representation of a PIC 106. The PIC 106 can be a software representation of a PIC within a computer environment. The PIC 106 can by any type of circuit, such as quadrature phase shift keying optical receiver, an array of optical ring resonators, and/or the like. The PIC 106 can include representations of optical and optoelectronic components, such as directional couplers, phase shifters, photo-detectors, laser diodes, light-emitting diodes, optical amplifiers, and associated electrical components used for control or power. In some implementations, the PIC 106 is displayed in a graphical user interface (GUI) via display 118. In some implementations, the PIC 106 is not displayed in a graphical user interface (GUI) via display 118.

The memory 104 can include (e.g., store) a representation of computational regions 108. In some implementations, computational regions 108 includes a plurality of computational regions. Each computational region in computational regions 108 can be associated with (e.g., overlap with, cover, etc.) a portion of PIC 106 different than remaining computational regions from computational regions 108. Each computational region in computational regions 108 is bounded by straight and/or curved sections; those sections can include region join boundaries, region side boundaries, or a combination of region join boundaries and region side boundaries. If a section is permitted to adjoin a section of another computational region, that section is a region join boundary. If a section is not permitted to adjoin a section of another computational region, that section is a region side boundary. Said similarly, computational regions can adjoin other computational regions at a region join boundaries but not at region side boundaries. The computational regions 108 can include computational regions having any shape, such as a ring, square, circle, rectangle, triangle, and/or the like. In some implementations, the computational regions 108 can be displayed as partially transparent and/or include transparent portions, and can be displayed in the GUI via the display 118 as overlapping on the PIC 106. The shape and/or location of the computational regions 108 can be provided solely by a user, solely by software (e.g., based on the layout of the PIC 106), or a combination thereof. In some implementations, the computational regions 108 are determined automatically based on WaveguideShapes 110. In such implementations, an initial analysis of the WaveguideShapes 110 can provide an estimate of the likely extent of the electromagnetic fields, and then computational regions 108 are sized to enclose all areas where the electromagnetic fields are significant (e.g., greater than a predetermined threshold). This initial analysis may use the optical modes of the cross-sections of individual WaveguideShapes from WaveguideShapes 110 and an estimate of the electromagnetic coupling between adjacent WaveguideShapes from WaveguideShapes 110. The computational regions 108 may also be updated based on previous electromagnetic simulation results 114, for example, by monitoring the magnitude of the electromagnetic fields at the boundaries of the computational regions. In some implementations, this update may cause two computational regions from computational regions 108 to be automatically merged into one larger computational region and included in computational regions 108. In some implementations, if the residual electromagnetic field at the region side boundary of a first computational region from computational regions 108, as predicted by an analysis of the WaveguideShapes contained by the computational region or as computed by a previous electromagnetic simulation result from electromagnetic simulation results 114, would be expected in the manufactured device to propagate to the domain defined by an adjacent, second computational region from computational regions 108, the first computational region and the second computational region may then be automatically merged into one larger computational region and included in computational regions 108. In some implementations, this analysis of the WaveguideShapes can include the study of the behavior of the optical modes guided by any waveguides contained in the computational region. This study could include the observation of the amplitude of the optical mode at the region side boundaries and also the extent to which the mode is leaking in the direction of the region side boundaries. In some implementations, a WaveguideShape refers to a two-dimensional shape that can define an electromagnetic waveguide or part thereof.

In some implementations, representation of any light flowing within the simulation environment into a region of the PIC 106 not covered by the computational regions 108 can be expected to be lost during simulation. Thus, computational regions typically adjoin where light is flowing. In some implementations, regions that adjoin can refer to computational regions that only overlap, only touch (abut), or a combination thereof.

The memory 104 can also include (e.g., store) a representation of electromagnetic simulation results 114. The electromagnetic simulation results 114 can represent the electromagnetic simulation results of computational regions 108. Said differently, electromagnetic simulations can be executed on each computational region from computational regions 108 to generate simulation results for that computational region. Each electromagnetic simulation result from electromagnetic simulation results 114 can represent the electromagnetic simulation result of a computational region from computational regions 108 different than remaining electromagnetic simulation result from electromagnetic simulation results 114. The electromagnetic simulations can be executed with references to computational regions from computational regions 108 that adjoin. As such, the results can more accurately resemble real-world behavior of PIC 106, since in the real world (i.e., not a computing environment), behavior in one region of a circuit can impact the behavior of another region of the circuit.

The memory 104 can also include (e.g., store) a representation of a simulated response 116. Simulated response 116 can represent a simulated response of PIC 106. Simulated response 116 can be generated based on electromagnetic simulation results 114. In some implementations, the simulation response of each computational region from computational regions 108 is represented by a scattering matrix relating an input vector to an output vector. The input vector specifies the electromagnetic fields flowing into one or more region join boundaries of that computational region. The output vector specifies the electromagnetic fields flowing out of one or more region join boundaries of that computational region. Given a pair of computational regions from computational regions 108 that share a region join boundary in whole or in part, the scattering matrix representing the combined simulation response of the pair of computational regions is computed from the two scattering matrices of the individual computational regions. This operation can be repeated until the scattering matrix representing the simulation response of the whole PIC 106 is obtained.

In some implementations, the memory 104 can also include (e.g., store) a representation of WaveguideShapes 110 and/or paths 112. In some implementations, WaveguideShapes 110 and paths 112 can be used (e.g., by a user, by electromagnetic simulation compute device 100, and/or the like) to define the computational regions 108. For example, a WaveguideShape can refer to a two-dimensional shape (e.g., that will be exported to a lithographic mask file; defining an electromagnetic waveguide or part thereof). In some instances, a Waveguideshape is a shape that defines a waveguide later during manufacturing (e.g., of the PIC). In some instances, a WaveguideShape can define an electromagnetic waveguide (or portion thereof) and/or an electrical path. In some implementations, a path refers to a path of finite length through a top and/or perspective view of PIC 106. The WaveguideShapes 110 and/or paths 112 can be displayed in the graphical user interface (GUI) via display 118. In some implementations, however, WaveguideShapes 110 and/or paths 112 are not used. In some implementations, paths 112 includes only main paths or a combination main paths and sub-paths.

In some implementations, the PIC 106, computational regions 108, WaveguideShapes 110, paths 112, electromagnetic simulation results 114, and/or simulated response 116 are defined, generated, processed, used, and/or the like via a simulation engine (e.g., and in a single simulation application/program). In some implementations, the simulation engine can be stored in memory 104. In some implementations, the simulation engine can model optical structures as ring resonators, optical gratings, photonic crystals, nanophotonics, and/or the like. In some implementations, the simulation engine can model plasmonics and/or metamaterials. In some implementations, the simulation engine can model electromagnetic fields within photonics structures. In some implementations, the simulation engine can model the propagation of light incident on 1D or 2D periodic structures (e.g., diffraction gratings, periodic metamaterials, diffractive optical elements, etc.).

In some implementations, paths 112 are used (e.g., by a human, by the electromagnetic simulation compute device 100) to guide the placement of computational regions 108. For example, a computational region placed near a path will be automatically extended to cover the length of the path and extend laterally on each side of the path by some predetermined or computed width. In some implementations, computational regions 108 are attached to path 112 so that they move with the path when the path is moved, extend in length when the path is lengthened or follow any other changes in the shape of the path.

In some instances, a representation of simulated response 116 can be displayed at display 118. In some instances, in response to simulated response 116 not meeting a set of predetermined criteria, a remedial action can occur and/or be triggered. For example, a warning message can be displayed at display 118 (e.g., that the simulation failed, that PIC 106 should be modified, that computational regions 108 should be modified, that Waveguideshapes 110 should be modified, that paths 112 should be modified, that human intervention is needed or recommended, and/or the like). As another example, PIC 106, computational regions 108, Waveguideshapes 110, and/or paths 112 can be automatically (e.g., by a software model and/or without human intervention) modified. An example of a predetermined criteria is a value (e.g., phase, amplitude, etc.) of light propagating within in PIC 106.

In some instances, in response to simulated response 116 not meeting a set of predetermined criteria, PIC 106, Waveguideshapes 110, and/or paths 112 are modified (e.g., by a user, by a software model, a combination thereof, and/or the like). In response to the modification, computational regions 108 can be updated automatically. For example, if an optical component in the PIC 106 is moved to another location within a GUI, the computational region associated with (e.g., covering) that optical component can also move to the new location within the GUI.

In some instances, a representation of PIC 106 can be fabricated (e.g., in response to simulated response 116 meeting a set of predetermined criteria). For example, an electronic signal including representation of PIC 106 can be sent to a compute device to cause the compute device to fabricate the PIC 106. For example, the compute device can be a lithographic mask writer that can fabricate the PIC 106 in response to receiving the electronic signal.

In some implementations, computational regions 108 indicate/define on which portions of the presentation of PIC 106 the simulation calculations will be separately performed. In some implementations, the computational regions 108 can be defined/placed without any use of paths 112. In some implementations, paths 112 and/or computational regions 108 are defined only manually, only autonomously via software, or a combination thereof (e.g., initially defined by software and confirmed and/or edited manually thereafter) Said differently, in some implementations, (1) paths 112 are used and manually defined (e.g., placed) by a user, and (2) WaveguideShapes 110 are manually defined (e.g. guided by the location of paths 112) and (3) computational regions 108 are manually defined (e.g., guided by the location of the WaveguideShapes 110 and/or paths 112). In another implementation, (1) paths 112 are used and manually defined (e.g., placed) by a user, and (2) WaveguideShapes 110 are manually defined (e.g. guided by the location of paths 112) and (3) computational regions 108 are defined automatically (e.g., guided by the location of the WaveguideShapes 110 and/or paths 112). In another implementation, (1) paths 112 are not used, (2) WaveguideShapes 110 are defined manually and (3) computational regions 108 are defined manually, (e.g., guided by the location of the WaveguideShapes 110). In another implementation, (1) paths 112 are not used, (2) WaveguideShapes 110 are defined manually and (3) computational regions 108 are defined automatically, (e.g., guided by the location of the WaveguideShapes 110). In another implementation, (1) paths 112 are not used, (2) WaveguideShapes 110 are defined automatically from an imported design of the PIC 106 and (3) computational regions 108 are defined manually, (e.g., guided by the location of the WaveguideShapes 110). In another implementation, (1) paths 112 are not used, (2) WaveguideShapes 110 are defined automatically from an imported design of the PIC and (3) computational regions 108 are defined automatically, (e.g., guided by the location of the WaveguideShapes 110). In some instances, a user can have the ability to correct the automatic placement of the computational regions 108 after the automatic placement has occurred and the results displayed.

In some implementations, the computational regions 108 (e.g., by default) start and stop at the ends of paths 112. For example, the computational regions 108 can be (e.g., by default) laterally centered on paths 112. In some implementations, the WaveguideShapes 110 (e.g., by default) start and stop at the ends of the paths 112 and/or are laterally centered by the paths 112. In some implementations, paths 112 can include sub-paths so that multiple different WaveguideShapes from WaveguideShapes 112 can be linked to one path from paths 112. In some implementations, the WaveguideShapes 110 could define a lateral offset from the paths 112 with an offset that varies along the paths 112, permitting a computational region and multiple WaveguideShapes to be attached to one path.

In some implementations, an offset exists between a WaveguideShape and path included in the WaveguideShape. For example, rather than the path being in the center of the WaveguideShape, the path can be closer to one side.

In some implementations, computational regions 108 can be identified based on a prediction(s) of (1) which WaveguideShapes from WaveguideShapes 110 are capable of guiding electromagnetic radiation (e.g., based on location, width, length, component type, and/or the like) and/or (2) which pairs of WaveguideShapes from WaveguideShapes 110 are electromagnetically coupled to each other (e.g., based on distance between WaveguideShapes). The predictions can be done, for example, by a human and provided to electromagnetic simulation compute device 100, performed by a software model (e.g., neural network) without human intervention, or a combination thereof (e.g., software model makes a first prediction and the user double checks).

In some implementations, WaveguideShapes 110 are identified prior to identifying computational regions 108. For example, paths 112 can be identified prior to WaveguideShapes 110, and WaveguideShapes 110 can be identified prior to computational regions 108. As another example, WaveguideShapes 110 can be identified prior to computational regions 108 (with paths 112 not being identified).

In some implementations, a third-party tool (e.g., running on a compute device not shown in FIG. 1) can generate a circuit layout (e.g., PIC 106), and send a representation of the circuit layout to electromagnetic simulation compute device 100. Computational regions 108 are added and simulations performed. Based on feedback from these simulations (e.g., sent from electromagnetic simulation compute device 100 to the compute device running the third-party tool), a user can adjust the layout in the third-party tool and re-export the updated layout to the electromagnetic simulation compute device 100. Feedback can continue to be sent/received from the user until the user, via their compute device, provides indication to the third-party tool to generate a lithographic mask file. Thus, in some implementations, electromagnetic simulation compute device 100 does not generate a mask layout file (but rather only guides the design of the layout). In some implementations, however, the electromagnetic simulation compute device 100 is able to generate the mask layout file and/or send a signal to another compute device to cause that compute device to generate the mask layout file.

Figure 2B:
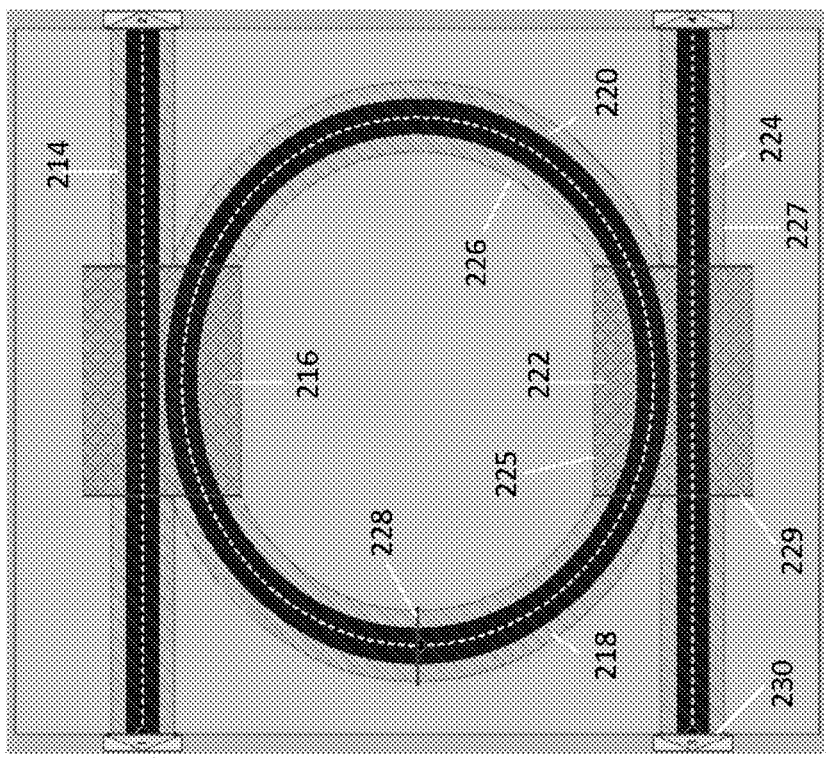
FIG. 2B shows an example of computational regions for the representation of the PIC shown in FIG. 2A, according to an embodiment.
Figure 2A:
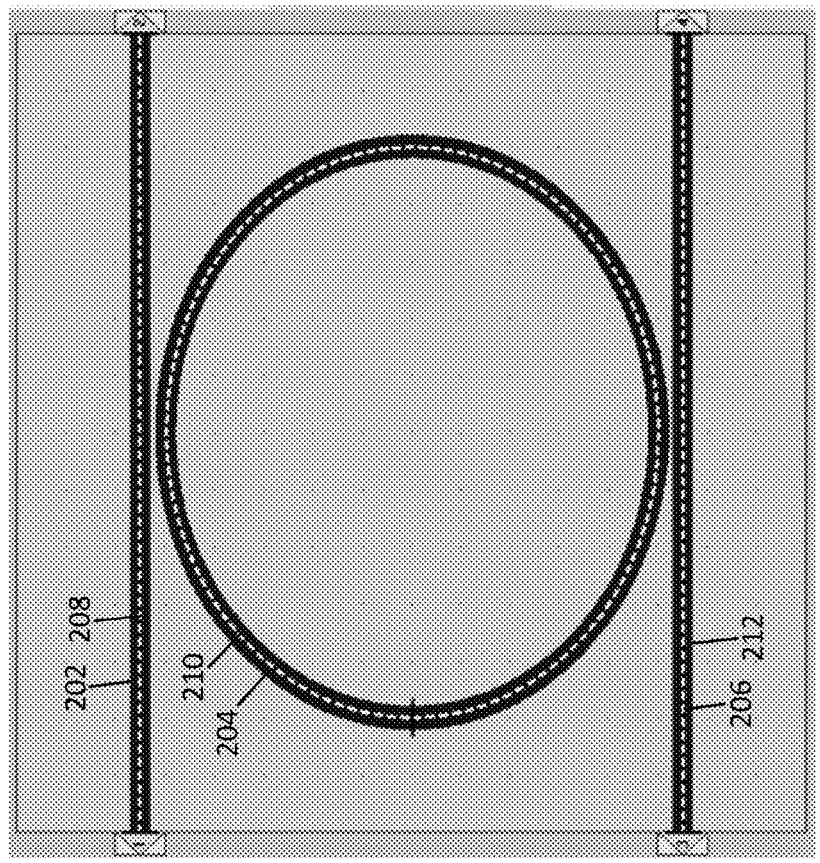
FIG. 2A shows an example of a representation of a photonic integrated circuit (PIC) in a graphical user interface (GUI), according to an embodiment.

FIG. 2A shows an example of a representation of a PIC in a GUI, according to an embodiment. The PIC represented in FIG. 2A is an optical ring resonator. The PIC represented in FIG. 2A includes WaveguideShapes 202, 204, 206 (solid lines), and paths 208, 210, 212 (dashed lines within the solid lines). As can be seen, paths 208, 210, 212 are within Waveguideshapes 202, 204, 206, respectively. FIG. 2B shows an example of computational regions for the representation of the PIC shown in FIG. 2A, according to an embodiment. FIG. 2B includes computational regions 214, 216, 218, 220, 222, 224 (e.g., similar to computational regions 108), region side boundaries 225, 226, 227 and region join boundaries 228, 229, 230. In some implementations, electromagnetic simulations can be run separately on each of computational regions 214, 216, 218, 220, 222, 224 to generate six different electromagnetic simulation results (since there are six computational regions) that are then used to generate a single simulation result of the PIC.

Figure 3:
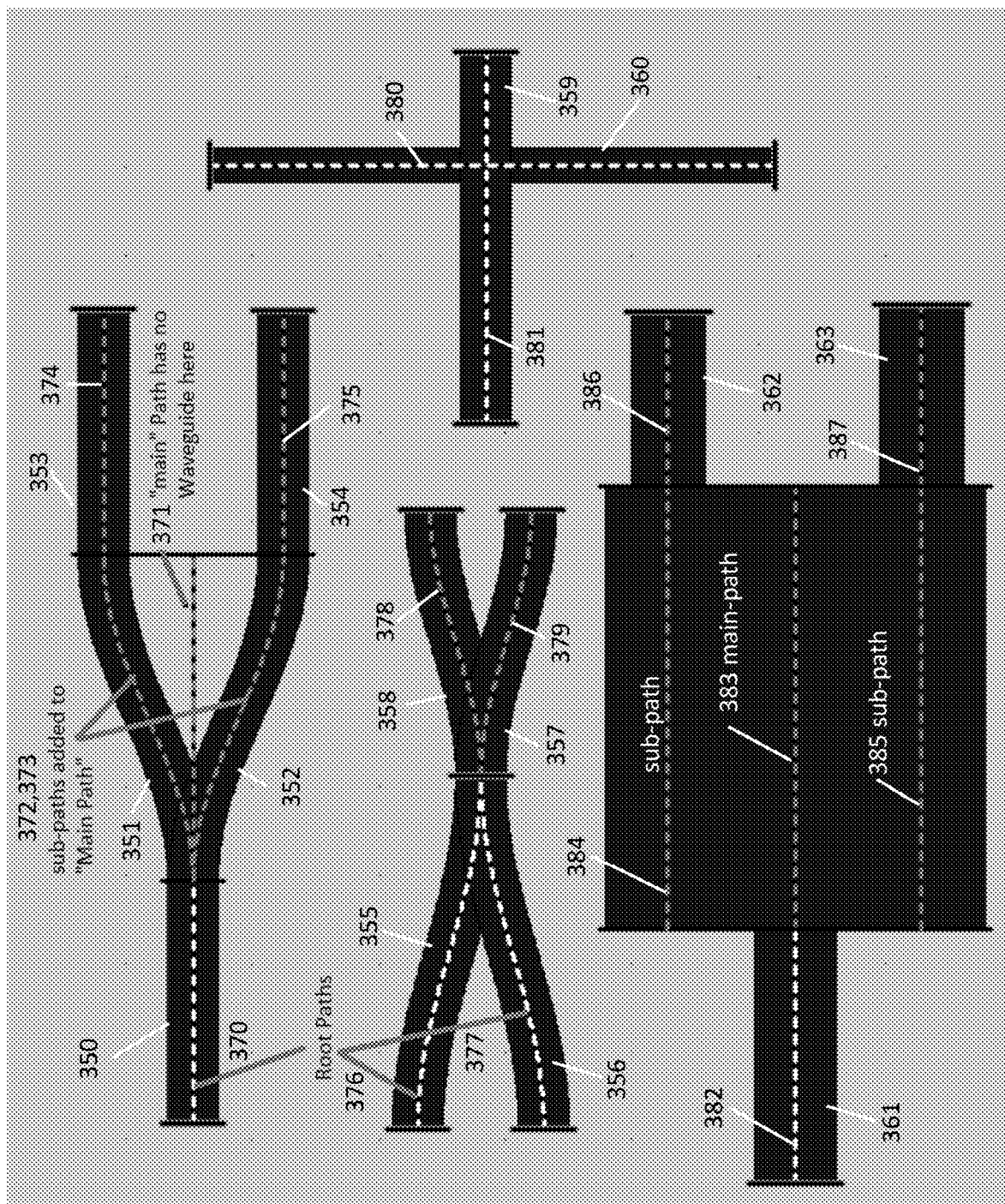
FIG. 3 shows an example of various paths and WaveguideShapes, according to an embodiment.

FIG. 3 shows an example of various paths and WaveguideShapes, according to an embodiment. FIG. 3 shows various sets of WaveguideShapes 350-363. FIG. 3 also shows various paths 370-387. Path 371 is attached to root path 370. Sub-paths 372 and 373 are attached to path 371. Paths 374 and 375 are attached to sub-paths 372 and 373. WaveguideShapes 350-354 are attached to paths 370-375. WaveguideShapes 355-358 are attached to paths 376-379.

WaveguideShapes 359-360 are attached to paths 380-381. WaveguideShapes 361-363 are attached to paths 382-387. In some instances, moving a root path causes every path attached to the root path to automatically move with that root path. In some instances, a sub-path provides a convenient way to guide multiple WaveguideShapes associated with a single computational region in different directions.

FIG. 4 shows a flowchart of a method 400 to generate a simulated response for a PIC, according to an embodiment. In some implementations, method 400 is performed by a processor (e.g., processor 102).

At 402, a plurality of computational regions (e.g., computational regions 108) for a PIC (e.g., PIC 106) are identified automatically and without requiring user input. Each computational region from the plurality of computational regions is associated with a portion of the PIC different than remaining computational regions from the plurality of computational regions. The plurality of computational regions includes adjoining regions of computational regions.

At 404, electromagnetic simulations are performed on each computational region from the plurality of computational regions to produce a plurality of electromagnetic simulation results (e.g., electromagnetic simulation results 114). In some implementations, 404 is performed automatically (e.g., without human intervention) in response to completing 402.

At 406, the plurality of electromagnetic simulation results are assembled based on the plurality of adjoining computational regions to determine a simulated response (e.g., simulated response 116) for the PIC. In some implementations, 406 is performed automatically (e.g., without human intervention) in response to completing 404.

In some implementations of method 400, the PIC is represented in a graphical user interface (GUI). Method 400 can further include receiving, based on input from the user, an indication to modify a layout of the PIC to produce a modified PIC represented in the GUI. Method 400 can further include automatically modifying, without additional input from the user, the plurality of computational regions for the modified PIC.

In some implementations, paths (e.g., paths 112) can be used at step 402 to help identify (e.g., by a processor) the plurality of computational regions. In some implementations, as paths are being defined and/or identified, paths can be automatically aligned (e.g., by a processor) to one another. For example, if a new path is being placed near an existing path, the closer ends of both paths can be automatically aligned via a processor.

Some implementations of method 400 further include receiving, based on an input from the user, indications of a set of WaveguideShapes (e.g., WaveguideShapes 110) defining at least a portion of the representation of the PIC. The plurality of computational regions can be identified based on the set of WaveguideShapes. In some implementations, the plurality of computational regions entirely cover the set of WaveguideShapes. In some implementations, the plurality of computational regions do not entirely cover the set of WaveguideShapes, and portions of the set of WaveguideShapes not covered by the plurality of computational regions are not considered during performing of the electromagnetic simulations and assembling of the plurality of electromagnetic simulation results.

In some implementations of method 400, identifying the plurality of computational regions, performing the electromagnetic simulations, and assembling the plurality of electromagnetic simulation results are performed within a single electromagnetic simulator application.

In some implementations of method 400, the PIC includes a set of WaveguideShapes (e.g., WaveguideShapes 110). Some implementations of method 400 further include generating a prediction of (1) which WaveguideShapes from the set of WaveguideShapes are capable of guiding electromagnetic radiation, and (2) which pairs of WaveguideShapes from the set of WaveguideShapes are electromagnetically coupled to each other, the plurality of computational regions identified based on the prediction.

FIG. 5 shows a flowchart of a method 500 to generate a simulated response for a PIC, according to an embodiment. In some implementations, method 500 is performed by a processor (e.g., processor 102).

At 502, a PIC (e.g., PIC 106) represented in a GUI is caused to be displayed (e.g., at display 118).

At 504, indications of a plurality of computational regions (e.g., computational regions 108) for the PIC are received based on an input from a user. Each computational region from the plurality of computational regions is associated with a portion of the PIC different than remaining computational regions from the plurality of computational regions. The plurality of computational regions includes adjoining regions of computational regions.

At 506, electromagnetic simulations are performed on each computational region from the plurality of computational regions to produce a plurality of electromagnetic simulation results (e.g., electromagnetic simulation results 114). In some implementations, 506 is performed automatically (e.g., without human intervention) in response to completing 504.

At 508, the plurality of electromagnetic simulation results are assembled based on the adjoining regions of computational regions to determine a simulated response (e.g., simulated response 116) for the PIC. In some implementations, 508 is performed automatically (e.g., without human intervention) in response to completing 506.

At 510, information that represents the PIC and that is associated with control of a lithographic mask writer is sent to fabricate the PIC based on the information. In some implementations, 510 is performed automatically (e.g., without human intervention) in response to completing 508.

In some implementations of method 500, the information is included in a file associated with input into the lithographic mask writer. The lithographic mask writer can be configured to cause the PIC to be fabricated based on the information.

In some implementations of method 500, the input is a first input. Some implementations of method 500 further include receiving, based on a second input from the user and before the displaying of the PIC, indications of a set of paths (e.g., paths 112) and a set of WaveguideShapes (e.g., Waveguideshapes 110). The set of paths and the set of WaveguideShapes can represent at least a portion of the PIC.

In some implementations of method 500, the input is a first input. Some implementations of method 500 further include receiving, based on second input from the user, indications of a set of paths (e.g., paths 112). At least one path from the set of paths can be within and/or pass at least one computational region from the plurality of computational regions such that at least one path from the set of paths passes through each computational region from the plurality of computational regions. In some instances, at least one path from the set of paths extends from one edge of a computational region from the plurality of computational regions to another edge of the computational region. In some implementations, an end of one path can readily be made contiguous with the beginning of another path in an adjoining computational region.

Some implementations of method 500 further include receiving, based on a second input from the user, indication to attach at least one WaveguideShape from a set of WaveguideShapes (e.g., Waveguideshapes) to a path from a set of paths (e.g., paths 112). Each WaveguideShape from the set of WaveguideShapes can extend along the whole length of the path or only part of it (e.g., based on the second input and/or a third input from the user). In some implementations, the WaveguideShape can be offset from its associated path (e.g., in response to an indication from the user to offset). The offset can be constant along the length of the path, vary along the length of the path, and/or a combination thereof.

In some implementations of method 500, the plurality of computational regions entirely cover all portions of the PIC having a magnitude of electromagnetic radiation predicted to be greater than a predetermined threshold. In some implementations of method 500, the plurality of computational regions do not entirely cover the PIC, and portions of the PIC not covered by the plurality of computational regions are not considered during the performing of the electromagnetic simulations and the assembling of the plurality of electromagnetic simulation results to determine the simulated response for the PIC.

In some implementations of method 500, the causing display of the PIC, the receiving of the indications of the plurality of computational regions for the PIC, the performing of the electromagnetic simulations, and the assembling of the plurality of electromagnetic simulation results is performed within a single electromagnetic simulator application. In some implementations, the PIC is a first PIC, the input is a first input, the plurality of computational regions is a first plurality of computational regions, and the plurality of electromagnetic simulation results are a first plurality of electromagnetic simulation results. Some implementations can further include receiving, from an application different than the single electromagnetic simulator application, representation of a second PIC different than the first PIC. Some implementations can further include receiving, based on a second input from the user, indications of a second plurality of computational regions for the second PIC. Each computational region from the second plurality of computational regions can be associated with a portion of the second PIC different than remaining computational regions from the second plurality of computational regions. The second plurality of computational regions can include adjoining regions of computational regions. Some implementations further include performing electromagnetic simulations on each computational region from the second plurality of computational regions to produce a second plurality of electromagnetic simulation results. Some implementations further include assembling, based on the adjoining regions of computational regions included in the second plurality of computational regions, the second plurality of electromagnetic simulation results to determine a simulated response for the second PIC. Some implementations further include causing the simulated response for the second PIC to be at least one of displayed or shared to the application. Some implementations further include receiving the first after the assembling of the second plurality of electromagnetic simulation results, and before the causing display of the first PIC.

In some implementations of method 500, the input is a first input and method 500 further includes receiving, based on a second input from the user, indications of a set of paths. A first path from the set of paths extends from a first edge of a first computational region from the plurality of the computational region to a second edge of the first computational region. A second path from the set of paths extends from a first edge of a second computational region from the plurality of computational regions to a second edge of the second computational region. The first computational region is adjacent to the second computational region and the first path is contiguous with the second path.

In some implementations of method 500, the input is a first input and method 500 further includes receiving, based on a second input from the user, indication from a user to attach a set of WaveguideShapes to a set of paths. Each WaveguideShape from the set of WaveguideShapes extends along at least one of an entire length of a path from the set of paths or only part of the path. Method 500 further includes receiving, based on a third input from the user, indication from the user of an offset from the path at that WaveguideShape. The offset is one of constant along a length of the path or varying along the length of the path. In some implementations, the offset is the lateral distance from the center of the WaveguideShape and the path for that WaveguideShape. In some implementations, sub-paths are offset from their main path, and there is no offset from the sub-path to the WaveguideShape for that sub-path.

FIG. 6 shows a flowchart of a method 600 to generate a simulated response for a PIC, according to an embodiment. In some implementations, method 600 is performed by a processor (e.g., processor 102).

At 602, representations of a first computational region for a photonic integrated circuit (PIC) and a second computational region for the PIC different than the first computational region are indicated at a display and in response to an input from a user. The first computational region adjoins at least partially with the second computational region via an adjoining boundary.

At 604, simulations are performed on (1) the first computational region to produce a first simulation result, and (2) the second computational region to produce a second simulation result. In some implementations, 604 is performed automatically (e.g., without human intervention) in response to completing 602.

At 606, a simulated response for the PIC is determined based on the first simulation result, the second simulation result, and the adjoining boundary. In some implementations, 606 is performed automatically (e.g., without human intervention) in response to completing 604.

At 608, information that represents the PIC and that is associated with control of a lithographic mask writer is sent to fabricate the PIC based on the information. In some implementations, 608 is performed automatically (e.g., without human intervention) in response to completing 606.

In some implementations of method 600, the information is included within a file associated with input into the lithographic mask writer. The lithographic mask writer can be configured to cause the PIC to be fabricated based on the information.

In some implementations of method 600, the input is a first input. Method 600 can further include identifying (e.g., manually and/or automatically and without requiring user input), a set of paths (e.g., paths 112) associated with the PIC. Some implementations further include receiving, via a second input from the user, confirmation that the set of paths are acceptable.

In some implementations of method 600, the adjoining boundary is a first adjoining boundary. Some implementations further include indicating, at the display and based on the input from the user, representation of a third computational region for the PIC different than the first computational region and the second computational region. The third computational region adjoins at least partially with at least one of the first computational region or the second computational region via a second adjoining boundary different than the first adjoining boundary. Some implementations further include performing a simulation on the third computational region to produce a third simulation result. Determining the simulated response for the PIC can be further based on the third simulation result and the second adjoining boundary.

In some implementations of method 600, the adjoining boundary is a first adjoining boundary. Some implementations further include indicating, at the display and based on the input from the user, representations of a third computational region for the PIC different than the first computational region and the second computational region and a fourth computational region for the PIC different than the first computational region, the second computational region, and the third computational region. The third computational region can adjoin at least partially with the fourth computational region via a second adjoining boundary different than the first adjoining boundary. Some implementations further include performing simulations on the third computational region to produce a third simulation result and the fourth computational region to produce a fourth simulation result. Determining the simulated response for the PIC can be further based on the third simulation result, the fourth simulation result, and the second adjoining boundary.

In some implementations of method 600, indicating the representations of the first computational region and the second computational region, performing the simulations, and determining the simulated response are performed within a single simulator application.

Some implementations of method 600 further include identifying, automatically and without requiring user input, a first potential computational region for the PIC. Some implementations further include identifying, automatically and without requiring user input, a second potential computational region for the PIC. Some implementations further include receiving, as the input, confirmation that the first computational region and the second computational region are acceptable. The first potential computational region can be the first computational region in response to receiving the confirmation and the second potential computational region can be the second computational region in response to receiving the confirmation.

All combinations of the foregoing concepts and additional concepts discussed herewithin (provided such concepts are not mutually inconsistent) are contemplated as being part of the subject matter disclosed herein. The terminology explicitly employed herein that also may appear in any disclosure incorporated by reference should be accorded a meaning most consistent with the particular concepts disclosed herein.

The drawings are primarily for illustrative purposes, and are not intended to limit the scope of the subject matter described herein. The drawings are not necessarily to scale; in some instances, various aspects of the subject matter disclosed herein may be shown exaggerated or enlarged in the drawings to facilitate an understanding of different features. In the drawings, like reference characters generally refer to like features (e.g., functionally similar and/or structurally similar elements).

The entirety of this application (including the Cover Page, Title, Headings, Background, Summary, Brief Description of the Drawings, Detailed Description, Embodiments, Abstract, Figures, Appendices, and otherwise) shows, by way of illustration, various embodiments in which the embodiments may be practiced. The advantages and features of the application are of a representative sample of embodiments only, and are not exhaustive and/or exclusive. Rather, they are presented to assist in understanding and teach the embodiments, and are not representative of all embodiments. As such, certain aspects of the disclosure have not been discussed herein. That alternate embodiments may not have been presented for a specific portion of the innovations or that further undescribed alternate embodiments may be available for a portion is not to be considered to exclude such alternate embodiments from the scope of the disclosure. It will be appreciated that many of those undescribed embodiments incorporate the same principles of the innovations and others are equivalent. Thus, it is to be understood that other embodiments may be utilized and functional, logical, operational, organizational, structural and/or topological modifications may be made without departing from the scope and/or spirit of the disclosure. As such, all examples and/or embodiments are deemed to be non-limiting throughout this disclosure.

Also, no inference should be drawn regarding those embodiments discussed herein relative to those not discussed herein other than it is as such for purposes of reducing space and repetition. For instance, it is to be understood that the logical and/or topological structure of any combination of any program components (a component collection), other components and/or any present feature sets as described in the figures and/or throughout are not limited to a fixed operating order and/or arrangement, but rather, any disclosed order is exemplary and all equivalents, regardless of order, are contemplated by the disclosure.

Unless described otherwise, the term "automatically" is used herein to modify actions that occur without direct input or prompting by an external source such as a user. Automatically occurring actions can occur periodically, sporadically, in response to a detected event (e.g., a user logging in), or according to a predetermined schedule.

The term "determining" encompasses a wide variety of actions and, therefore, "determining" can include calculating, computing, processing, deriving, investigating, looking up (e.g., looking up in a table, a database or another data structure), ascertaining and the like. Also, "determining" can include receiving (e.g., receiving information), accessing (e.g., accessing data in a memory) and the like. Also, "determining" can include resolving, selecting, choosing, establishing and the like.

The phrase "based on" does not mean "based only on," unless expressly specified otherwise. In other words, the phrase "based on" describes both "based only on" and "based at least on."

Unless otherwise discussed, the term "processor" can be interpreted broadly to encompass a general purpose processor, a central processing unit (CPU), a microprocessor, a digital signal processor (DSP), a graphics processing unit (GPU), a controller, a microcontroller, a state machine and/or the like so forth. Under some circumstances, a "processor" may refer to an application specific integrated circuit (ASIC), a programmable logic device (PLD), a field programmable gate array (FPGA), etc. The term "processor" may refer to a combination of processing devices, e.g., a combination of a DSP and a microprocessor, a plurality of microprocessors, one or more microprocessors in conjunction with a DSP core or any other such configuration.

The term "memory" should be interpreted broadly to encompass any electronic component capable of storing electronic information. The term memory may refer to various types of processor-readable media such as random access memory (RAM), read-only memory (ROM), non-volatile random access memory (NVRAM), programmable read-only memory (PROM), erasable programmable read only memory (EPROM), electrically erasable PROM (EEPROM), flash memory, magnetic or optical data storage, registers, etc. Memory is said to be in electronic communication with a processor if the processor can read information from and/or write information to the memory. Memory that is integral to a processor is in electronic communication with the processor.

The terms "instructions" and "code" should be interpreted broadly to include any type of computer-readable statement(s). For example, the terms "instructions" and "code" may refer to one or more programs, routines, subroutines, functions, procedures, etc. "Instructions" and "code" may comprise a single computer-readable statement or many computer-readable statements.

Some embodiments described herein relate to a computer storage product with a non-transitory computer-readable medium (also can be referred to as a non-transitory processor-readable medium) having instructions or computer code thereon for performing various computer-implemented operations. The computer-readable medium (or processor-readable medium) is non-transitory in the sense that it does not include transitory propagating signals per se (e.g., a propagating electromagnetic wave carrying information on a transmission medium such as space or a cable). The media and computer code (also can be referred to as code) may be those designed and constructed for the specific purpose or purposes. Examples of non-transitory computer-readable media include, but are not limited to, magnetic storage media such as hard disks, floppy disks, and magnetic tape; optical storage media such as Compact Disc/Digital Video Discs (CD/DVDs), Compact Disc-Read Only Memories (CD-ROMs), and holographic devices; magneto-optical storage media such as optical disks; carrier wave signal processing modules; and hardware devices that are specially configured to store and execute program code, such as Application-Specific Integrated Circuits (ASICs), Programmable Logic Devices (PLDs), Read-Only Memory (ROM) and Random-Access Memory (RAM) devices. Other embodiments described herein relate to a computer program product, which can include, for example, the instructions and/or computer code discussed herein.

Some embodiments and/or methods described herein can be performed by software (executed on hardware), hardware, or a combination thereof. Hardware modules may include, for example, a general-purpose processor, a field programmable gate array (FPGA), and/or an application specific integrated circuit (ASIC). Software modules (executed on hardware) can be expressed in a variety of software languages (e.g., computer code), including C, C++, Java™ Ruby, Visual Basic™, and/or other object-oriented, procedural, or other programming language and development tools. Examples of computer code include, but are not limited to, micro-code or micro-instructions, machine instructions, such as produced by a compiler, code used to produce a web service, and files containing higher-level instructions that are executed by a computer using an interpreter. For example, embodiments may be implemented using imperative programming languages (e.g., C, Fortran, etc.), functional programming languages (Haskell, Erlang, etc.), logical programming languages (e.g., Prolog), object-oriented programming languages (e.g., Java, C++, etc.) or other suitable programming languages and/or development tools. Additional examples of computer code include, but are not limited to, control signals, encrypted code, and compressed code.

Various concepts may be embodied as one or more methods, of which at least one example has been provided. The acts performed as part of the method may be ordered in any suitable way. Accordingly, embodiments may be constructed in which acts are performed in an order different than illustrated, which may include performing some acts simultaneously, even though shown as sequential acts in illustrative embodiments. Put differently, it is to be understood that such features may not necessarily be limited to a particular order of execution, but rather, any number of threads, processes, services, servers, and/or the like that may execute serially, asynchronously, concurrently, in parallel, simultaneously, synchronously, and/or the like in a manner consistent with the disclosure. As such, some of these features may be mutually contradictory, in that they cannot be simultaneously present in a single embodiment. Similarly, some features are applicable to one aspect of the innovations, and inapplicable to others.

In addition, the disclosure may include other innovations not presently described. Applicant reserves all rights in such innovations, including the right to embodiment such innovations, file additional applications, continuations, continuations-in-part, divisional s, and/or the like thereof. As such, it should be understood that advantages, embodiments, examples, functional, features, logical, operational, organizational, structural, topological, and/or other aspects of the disclosure are not to be considered limitations on the disclosure as defined by the embodiments or limitations on equivalents to the embodiments. Depending on the particular desires and/or characteristics of an individual and/or enterprise user, database configuration and/or relational model, data type, data transmission and/or network framework, syntax structure, and/or the like, various embodiments of the technology disclosed herein may be implemented in a manner that enables a great deal of flexibility and customization as described herein.

All definitions, as defined and used herein, should be understood to control over dictionary definitions, definitions in documents incorporated by reference, and/or ordinary meanings of the defined terms.

As used herein, in particular embodiments, the terms "about" or "approximately" when preceding a numerical value indicates the value plus or minus a range of 10%. Where a range of values is provided, it is understood that each intervening value, to the tenth of the unit of the lower limit unless the context clearly dictates otherwise, between the upper and lower limit of that range and any other stated or intervening value in that stated range is encompassed within the disclosure. That the upper and lower limits of these smaller ranges can independently be included in the smaller ranges is also encompassed within the disclosure, subject to any specifically excluded limit in the stated range. Where the stated range includes one or both of the limits, ranges excluding either or both of those included limits are also included in the disclosure.

The indefinite articles "a" and "an," as used herein in the specification and in the embodiments, unless clearly indicated to the contrary, should be understood to mean "at least one."

The phrase "and/or," as used herein in the specification and in the embodiments, should be understood to mean "either or both" of the elements so conjoined, i.e., elements that are conjunctively present in some cases and disjunctively present in other cases. Multiple elements listed with "and/or" should be construed in the same fashion, i.e., "one or more" of the elements so conjoined. Other elements may optionally be present other than the elements specifically identified by the "and/or" clause, whether related or unrelated to those elements specifically identified. Thus, as a non-limiting example, a reference to "A and/or B", when used in conjunction with open-ended language such as "comprising" can refer, in one embodiment, to A only (optionally including elements other than B); in another embodiment, to B only (optionally including elements other than A); in yet another embodiment, to both A and B (optionally including other elements); etc.

As used herein in the specification and in the embodiments, "or" should be understood to have the same meaning as "and/or" as defined above. For example, when separating items in a list, "or" or "and/or" shall be interpreted as being inclusive, i.e., the inclusion of at least one, but also including more than one, of a number or list of elements, and, optionally, additional unlisted items. Only terms clearly indicated to the contrary, such as "only one of" or "exactly one of," or, when used in the embodiments, "consisting of," will refer to the inclusion of exactly one element of a number or list of elements. In general, the term "or" as used herein shall only be interpreted as indicating exclusive alternatives (i.e. "one or the other but not both") when preceded by terms of exclusivity, such as "either," "one of," "only one of," or "exactly one of." "Consisting essentially of," when used in the embodiments, shall have its ordinary meaning as used in the field of patent law.

As used herein in the specification and in the embodiments, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified. Thus, as a non-limiting example, "at least one of A and B" (or, equivalently, "at least one of A or B," or, equivalently "at least one of A and/or B") can refer, in one embodiment, to at least one, optionally including more than one, A, with no B present (and optionally including elements other than B); in another embodiment, to at least one, optionally including more than one, B, with no A present (and optionally including elements other than A); in yet another embodiment, to at least one, optionally including more than one, A, and at least one, optionally including more than one, B (and optionally including other elements); etc.

In the embodiments, as well as in the specification above, all transitional phrases such as "comprising," "including," "carrying," "having," "containing," "involving," "holding," "composed of," and the like are to be understood to be open-ended, i.e., to mean including but not limited to. Only the transitional phrases "consisting of" and "consisting essentially of" shall be closed or semi-closed transitional phrases, respectively, as set forth in the United States Patent Office Manual of Patent Examining Procedures, Section 2111.03.

The invention claimed is:

1. A non-transitory processor-readable medium storing code representing instructions to be executed by one or more processors, the instructions comprising code to cause the one or more processor to:
   identify, automatically and without requiring user input, a plurality of computational regions for a representation of a photonic integrated circuit (PIC) after generating the representation of the PIC, each computational region from the plurality of computational regions associated with a portion of the representation of the PIC different than remaining computational regions from the plurality of computational regions, the plurality of computational regions including adjoining regions of computational regions, each computational region from the plurality of computational regions associated with a shape and a location;
   perform electromagnetic simulations on each computational region from the plurality of computational regions to produce a plurality of electromagnetic simulation results; and
   assemble, based on the plurality of computational regions, the plurality of electromagnetic simulation results to determine a simulated response for the representation of the PIC.

2. The non-transitory processor-readable medium of claim 1, wherein the representation of the PIC is represented in a graphical user interface (GUI) and the code further comprises code to cause the one or more processors to:
   receive, based on input from the user, an indication to modify a layout of the PIC to produce a representation of a modified PIC represented in the GUI; and
   automatically modify, without additional input from the user, at least one of the shape or the location for a computational region from the plurality of computational regions for the representation of the modified PIC.

3. The non-transitory processor-readable medium of claim 1, wherein the code further comprises code to cause the one or more processors to:
   receive, based on an input from the user, indications of a set of WaveguideShapes defining at least a portion of the representation of the PIC, the plurality of computational regions identified based on the set of WaveguideShapes.

4. The non-transitory processor-readable medium of claim 3, wherein the plurality of computational regions entirely cover the set of WaveguideShapes.

5. The non-transitory processor-readable medium of claim 3, wherein the plurality of computational regions do not entirely cover the set of WaveguideShapes, and portions of the set of WaveguideShapes not covered by the plurality of computational regions are not considered during performing of the electromagnetic simulations and assembling of the plurality of electromagnetic simulation results.

6. The non-transitory processor-readable medium of claim 1, wherein identifying the plurality of computational regions, performing the electromagnetic simulations, and assembling the plurality of electromagnetic simulation results are performed within a single electromagnetic simulator application.

7. The non-transitory processor-readable medium of claim 1, wherein the representation of the PIC includes a set of WaveguideShapes, and the code further comprises code to cause the one or more processors to:
   generate a prediction of (1) which WaveguideShapes from the set of WaveguideShapes are capable of guiding electromagnetic radiation, and (2) which pairs of WaveguideShapes from the set of WaveguideShapes are electromagnetically coupled to each other, the plurality of computational regions identified based on the prediction.

8. A method, comprising:
causing display, via a processor, of a representation of a photonic integrated circuit (PIC) represented in a graphical user interface (GUI);
receiving, via the processor and based on an input from a user, indications of a plurality of computational regions for the representation of the PIC after generating the representation of the PIC, each computational region from the plurality of computational regions associated with a portion of the representation of the PIC different than remaining computational regions from the plurality of computational regions, the plurality of computational regions including adjoining regions of computational regions;
performing, via the processor, electromagnetic simulations on each computational region from the plurality of computational regions to produce a plurality of electromagnetic simulation results;
assembling, via the processor and based on the adjoining regions of computational regions, the plurality of electromagnetic simulation results to determine a simulated response for the representation of the PIC; and
sending, via the processor, information that represents the representation of the PIC and that is associated with control of a lithographic mask writer to fabricate the PIC based on the information.

9. The method of claim 8, wherein the information is included in a file associated with input into the lithographic mask writer, and the lithographic mask writer is configured to cause the PIC to be fabricated based on the information.

10. The method of claim 8, wherein the input is a first input, the method further comprising:
receiving, via the processor, based on a second input from the user, and before the displaying of the representation of the PIC, indications of a set of WaveguideShapes, the set of WaveguideShapes representing at least a portion of the representation of the PIC.

11. The method of claim 8, wherein the input is a first input, the method further comprising:
receiving, via the processor and based on a second input from the user, indications of a set of paths,
a first path from the set of paths extending from a first edge of a first computational region from the plurality of the computational region to a second edge of the first computational region,
a second path from the set of paths extending from a first edge of a second computational region from the plurality of computational regions to a second edge of the second computational region, the first computational region adjacent to the second computational region, the first path contiguous with the second path.

12. The method of claim 8, wherein the input is a first input, the method further comprising:
receiving, via the processor and based on a second input from the user, indication from a user to attach a set of WaveguideShapes to a set of paths, each WaveguideShape from the set of WaveguideShapes extending along at least one of an entire length of a path from the set of paths or only part of the path, and
receiving, via the processor and based on a third input from the user, indication from the user of an offset from the path at that WaveguideShape, the offset being one of constant along a length of the path or varying along the length of the path.

13. The method of claim 8, wherein the plurality of computational regions entirely cover only portions of the representation of the PIC having a magnitude of electromagnetic radiation predicted to be greater than a predetermined threshold.

14. The method of claim 8, wherein the plurality of computational regions do not entirely cover the representation of the PIC, and portions of the representation of the PIC not covered by the plurality of computational regions are not considered during the performing of the electromagnetic simulations and the assembling of the plurality of electromagnetic simulation results to determine the simulated response for the representation of the PIC.

15. The method of claim 8, wherein (1) the causing display of the representation of the PIC, the receiving of the indications of the plurality of computational regions for the representation of the PIC, the performing of the electromagnetic simulations, and the assembling of the plurality of electromagnetic simulation results is performed within a single electromagnetic simulator application, (2) the representation of the PIC is a representation of a first PIC, (3) the input is a first input, (4) the plurality of computational regions is a first plurality of computational regions, (5) the plurality of electromagnetic simulation results are a first plurality of electromagnetic simulation results, and (6) the method further comprises:
receiving, via the processor and from an application different than the single electromagnetic simulator application, a representation of a second PIC different than the representation of the first PIC;
receiving, via the processor and based on a second input from the user, indications of a second plurality of computational regions for the representation of the second PIC, each computational region from the second plurality of computational regions associated with a portion of the representation of the second PIC different than remaining computational regions from the second plurality of computational regions, the second plurality of computational regions including adjoining regions of computational regions;
performing, via the processor, electromagnetic simulations on each computational region from the second plurality of computational regions to produce a second plurality of electromagnetic simulation results;
assembling, via the processor and based on the adjoining regions of computational regions included in the second plurality of computational regions, the second plurality of electromagnetic simulation results to determine a simulated response for the representation of the second PIC; and
causing, via the processor, the simulated response for the representation of the second PIC to be at least one of displayed or shared to the application,
receiving the representation of the first PIC via the processor, after the assembling of the second plurality of electromagnetic simulation results, and before the causing display of the representation of the first PIC.

16. An apparatus, comprising:
a memory; and
a processor operatively coupled to the memory, the processor configured to:
indicate, at a display and in response to an input from a user, representations of a first computational region for a representation of a photonic integrated circuit (PIC)

and a second computational region for the representation of the PIC different than the first computational region after the representation of the PIC has been generated, the first computational region adjoining at least partially with the second computational region via an adjoining boundary;

perform simulations on (1) the first computational region to produce a first simulation result, and (2) the second computational region to produce a second simulation result;

determine a simulated response for the representation of the PIC based on the first simulation result, the second simulation result, and the adjoining boundary; and send information that represents the representation of the PIC and that is associated with control of a lithographic mask writer to fabricate the PIC based on the information.

17. The apparatus of claim 16, wherein the information is included within a file associated with input into the lithographic mask writer, and the lithographic mask writer is configured to cause the PIC to be fabricated based on the information.

18. The apparatus of claim 16, wherein the input is a first input, and the processor is further configured to:
identify a set of paths associated with the representation of the PIC; and
receive, via a second input from the user, confirmation that the set of paths are acceptable.

19. The apparatus of claim 16, wherein the adjoining boundary is a first adjoining boundary and the processor is further configured to:
indicate, at the display and based on the input from the user, representation of a third computational region for the representation of the PIC different than the first computational region and the second computational region, the third computational region adjoining at least partially with at least one of the first computational region or the second computational region via a second adjoining boundary different than the first adjoining boundary; and
perform a simulation on the third computational region to produce a third simulation result,
the processor configured to determine the simulated response for the representation of the PIC based on the third simulation result and the second adjoining boundary.

20. The apparatus of claim 16, wherein the adjoining boundary is a first adjoining boundary and the processor is further configured to:
indicate, at the display and based on the input from the user, representations of a third computational region for the representation of the PIC different than the first computational region and the second computational region and a fourth computational region for the representation of the PIC different than the first computational region, the second computational region, and the third computational region, the third computational region adjoining at least partially with the fourth computational region via a second adjoining boundary different than the first adjoining boundary; and
perform simulations on the third computational region to produce a third simulation result and the fourth computational region to produce a fourth simulation result,
the processor configured to determine the simulated response for the representation of the PIC based on the third simulation result, the fourth simulation result, and the second adjoining boundary.

21. The apparatus of claim 16, wherein indicating the representations of the first computational region and the second computational region, performing the simulations, and determining the simulated response are performed within a single simulator application.

22. The apparatus of claim 16, wherein the processor is further configured to:
identify, automatically and without requiring user input, a first potential computational region for the representation of the PIC;
identify, automatically and without requiring user input, a second potential computational region for the representation of the PIC; and
receive, as the input, confirmation that the first computational region and the second computational region are acceptable, the first potential computational region being the first computational region in response to receiving the confirmation and the second potential computational region being the second computational region in response to receiving the confirmation.

* * * * *